United States Patent
Komatsu

(10) Patent No.: US 6,172,578 B1
(45) Date of Patent: Jan. 9, 2001

(54) OSCILLATION CIRCUIT SUITABLE FOR UPPER HETERODYNE RECEIVER

(75) Inventor: Michihiro Komatsu, Fukushima-ken (JP)

(73) Assignee: Alps Electric Co., Ltd, Tokyo (JP)

(*) Notice: Under 35 U.S.C. 154(b), the term of this patent shall be extended for 0 days.

(21) Appl. No.: 09/441,606

(22) Filed: Nov. 16, 1999

(30) Foreign Application Priority Data

Nov. 25, 1998 (JP) .................................................. 10-333795

(51) Int. Cl.$^7$ ................. H03B 5/12; H03B 5/18; H03B 5/08
(52) U.S. Cl. ................... 331/117 R; 331/36 C; 331/96; 331/117 D; 331/175; 331/177 V
(58) Field of Search ................... 331/36 C, 96, 331/117 R, 117 FE, 117 D, 175, 177 V

(56) References Cited

U.S. PATENT DOCUMENTS

| | | | |
|---|---|---|---|
| 4,249,262 | * 2/1981 | Fenk | ................ 455/333 |
| 4,639,691 | * 1/1987 | Iigima | ................ 331/99 |
| 5,694,092 | 12/1997 | Oba et al. | . |
| 5,712,596 | 1/1998 | Van Amesfoort | . |

* cited by examiner

*Primary Examiner*—David Mis
(74) *Attorney, Agent, or Firm*—Brinks Hofer Gilson & Lione

(57) ABSTRACT

Feedback capacitors and first inductance means which constructs a parallel resonance circuit together with the feedback capacitors are provided, the first inductance means is comprised of second inductance means whose inductance equivalent value increases as the frequency becomes lower and third inductance means which is connected to the second inductance means in series, and an oscillation signal is outputted from both ends of the third inductance means.

8 Claims, 3 Drawing Sheets

OSCILLATION CIRCUIT SUITABLE FOR UPPER HETERODYNE RECEIVER

BACKGROUND OF THE INVENTION

1. Field of the Invention

The present invention relates to an oscillation circuit and, more particularly, an oscillation circuit suitable for use as a local oscillator of an upper heterodyne receiver.

2. Description of the Related Art

For example, in the case of frequency-converting a television signal in a band of tens MHz to hundreds MHz to a television intermediate frequency signal, the television signal is once frequency-converted to a first intermediate frequency signal in a high band of 1300 MHz. At this time, a local oscillator oscillates at a frequency higher than 1300 MHz.

A conventional oscillation circuit used as such a local oscillator is shown in FIG. 5. The oscillation circuit is of a common collector type. The collector of an oscillation transistor 31 to which a source voltage (E) is applied is connected to the ground in a high frequency manner by a d.c. blocking capacitor 32 and feedback capacitors 33 and 34 are connected between the base and emitter and between the emitter and collector, respectively. Inductance means 35 is connected between the base and the ground. The inductance means 35 is connected in parallel to the feedback capacitors 33 and 34 which are connected in series in a high frequency manner and becomes equivalently inductive at an oscillation frequency.

In the inductance means 35, a clap capacitor 36, a varactor diode 37, and an inductor 38 are connected in series. An oscillation frequency is determined by a parallel resonance frequency obtained by an equivalent inductance of the inductance means 35 and a series capacity of the feedback capacitors 33 and 34 which are connected in series.

A resistor 39 is connected between the emitter of the oscillator transistor 31 and the ground and a resistor 40 is connected between the base and the ground. A source voltage (E) is supplied to the base via a resistor 41. The resistor 39 serves as an emitter-bias resistor for supplying a bias voltage to the emitter. The resistors 40 and 41 serve as base-bias resistors for applying a bias voltage to the base.

An oscillation signal outputted from the emitter of the oscillation transistor 31 is supplied to an amplifier 43 via a pickup capacitor 42 and supplied to a mixing circuit (not shown) from the amplifier 43.

At this time, a control voltage V is applied to the cathode of the varactor diode 37 by a choke coil 44. The capacity of the varactor diode 37 is changed by changing the voltage V, thereby varying the oscillation frequency in correspondence with the frequency of the television signal to be received.

Specifically, the capacity of the varactor diode 37 decreases as the control voltage V applied to the varactor diode 37 is made higher, an inductance equivalent value of the inductance means 35 decreases and the oscillation frequency becomes higher.

As the control voltage V applied to the varactor diode 37 is decreased, the capacity of the varactor diode 37 increases, an inductance equivalent value of the inductance means 35 increases, and the oscillation frequency becomes lower.

Generally, the level of the oscillation signal outputted from the oscillation circuit becomes higher as the oscillation frequency is lowered. Noises are also produced from the oscillation circuit and the level of the noises also becomes higher as the frequency is lowered.

When the oscillation circuit is used as a local oscillation circuit of an upper heterodyne receiver, high-level noise in a first intermediate frequency band which is lower than the oscillation frequency is carried to a mixing circuit. Consequently, there is a drawback that the S/N ratio of the first intermediate frequency signal deteriorates.

SUMMARY OF THE INVENTION

It is therefore an object of the invention to provide an oscillation circuit in which the S/N ratio of a first intermediate frequency signal of a receiver is increased by suppressing noise at frequencies lower than an oscillation frequency.

In order to achieve the object, according to the invention, there is provided an oscillation circuit comprising a feedback capacitor and first inductance means which constructs a parallel resonance circuit together with the feedback capacitor, wherein the first inductance means is comprised of second inductance means whose inductance equivalent value increases as the frequency is lowered and third inductance means which is connected to the second inductance means in series, and an oscillation signal is outputted from both ends of the third inductance means.

The second inductance means of the oscillation circuit of the invention comprises a first inductor and a variable capacitor which is connected to the first inductor in series, and the frequency of the oscillation signal is controlled by varying the capacity value of the variable capacitor.

The third inductance means of the oscillation circuit of the invention is constructed by a second inductor, the first inductor and the second inductor are connected in series and are integrated as a first microstrip line, and the oscillation signal is outputted from a some midpoint in the longitudinal direction of the first microstrip line.

The second inductance means of the oscillation circuit of the invention comprises a third inductor and a variable capacitor which is connected to the third inductor in parallel, and the frequency of the oscillation signal is controlled by changing the capacity value of the variable capacitor.

The third inductance means of an oscillation circuit of the invention is constructed by a fourth inductor, the third inductor and the fourth inductor are connected in series and are integrated as a second microstrip line, and the oscillation signal is outputted from a some midpoint in the longitudinal direction of the second microstrip line.

According to the oscillation circuit of the invention, the variable capacitor is constructed by a varactor diode and the frequency of the oscillation signal is controlled by changing a control voltage which varies the capacity of the varactor diode.

According to the oscillation circuit of the invention, one end of the third inductance means is connected to the ground in a high frequency manner.

DETAILED DESCRIPTION OF THE PREFERRED EMBODIMENTS

An oscillation circuit of the invention will be described with reference to FIGS. 1 to 4.

Figure 1:
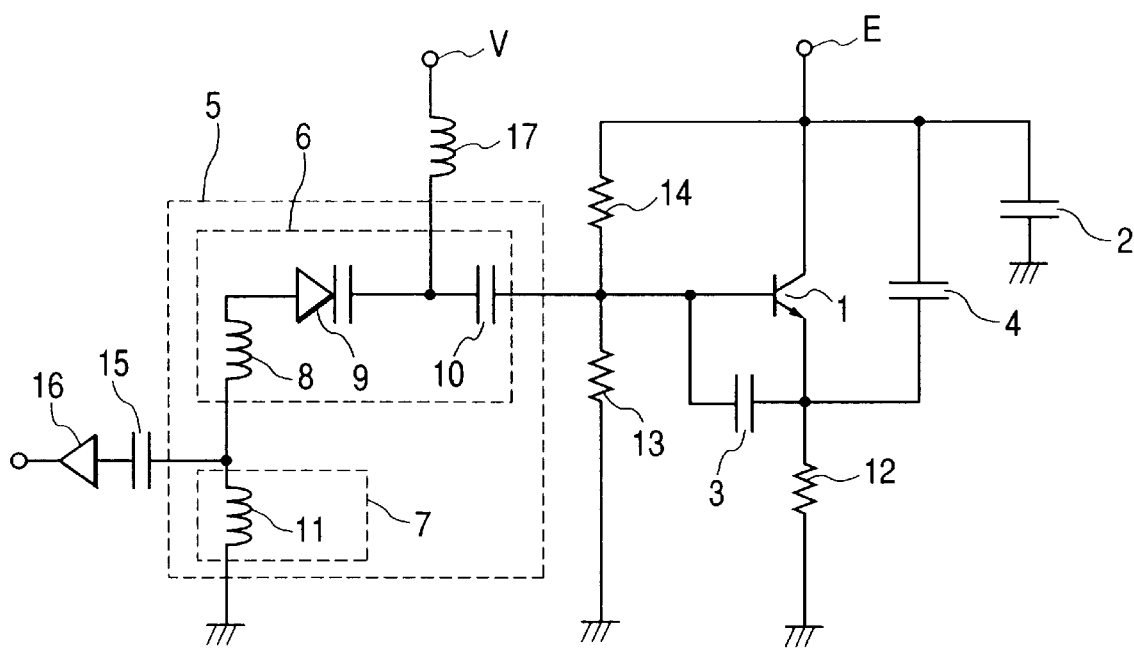
FIG. 1 is a circuit diagram showing the configuration of an oscillation circuit of the invention.

First, the oscillation circuit shown in FIG. 1 is an oscillation circuit of a common collector type. The collector of an oscillation transistor 1 to which a source voltage (E) is applied is connected to the ground in a high frequency manner by a d.c. blocking capacitor 2. Feedback capacitors 3 and 4 are connected between the base and emitter and between the emitter and collector, respectively. First inductance means 5 is connected between the base and the ground. The first inductance means 5 is connected in parallel to the feedback capacitors 3 and 4 which are connected in series in a high frequency manner and becomes equivalently inductive at the oscillation frequency.

In the first inductance means 5, a second inductance means 6 and a third inductance means 7 are connected in series. In the second inductance means 6, a first inductor 8, a varactor diode 9, and a clap capacitor 10 are connected in series. The third inductance means 7 is constructed by a second inductor 11. One end of the second inductor 11 is connected to the ground and the other end is connected to the first inductor 8. Further, the varactor diode 9 is connected to the first inductor 8, the clap capacitor 10 is connected to the varactor diode 9, and the clap capacitor 10 is connected to the base of the oscillation transistor 1.

The oscillation frequency is determined by a parallel resonance frequency obtained by an inductance equivalent value of the first inductance means 5 and a series capacity of the feedback capacitors 3 and 4 which are connected in series.

A resistor 12 is connected between the emitter of the oscillation transistor 1 and the ground and a resistor 13 is connected between the base and the ground. A source voltage (E) is supplied via a resistor 14 to the base. The resistor 12 serves as an emitter bias resistor for applying a bias voltage to the emitter. The resistors 13 and 14 serve as base bias resistors for applying a bias voltage to the base. A d.c. operating point is given to the oscillation transistor 1 by the bias resistors 12, 13, and 14.

An oscillation signal outputted from a connection point of the first inductor 8 and the second inductor 11 is supplied to an amplifier 16 via a pickup capacitor 15 and supplied from the amplifier 16 to a mixing circuit (not shown).

At this time, a control voltage V is applied by a choke coil 17 to the cathode of the varactor diode 9. By changing the control voltage V, the capacity of the varactor diode 9 is changed and the oscillation frequency is accordingly changed in correspondence with the frequency of a television signal to be received.

That is, as the control voltage V applied to the varactor diode 9 is increased, the capacity of the varactor diode 9 decreases, an inductance equivalent value of the second inductance means 6 decreases, and an inductance equivalent value of the first inductance means 5 decreases, so that the oscillation frequency becomes higher.

As the control voltage V applied to the varactor diode 9 is decreased, the capacity of the varactor diode 9 increases and an inductance equivalent value of the second inductance means 6 increases. Consequently, an inductance equivalent value of the first inductance means 5 increases and the oscillation frequency is lowered.

When the inductance value of the second inductance means 6 increases, the ratio of the level of the oscillation signal generated at both ends of the third inductance means 7 to the level of the oscillation signal generated at both ends of the first inductance means 5 is lowered. Consequently, as the oscillation frequency is lowered, the oscillation signal outputted from the connection point between the first inductor 8 and the second inductor 11 decreases.

Similarly, as the frequency is lowered, the level of noise included in the oscillation signal is lowered.

When the oscillation circuit is used as a local oscillation circuit of the upper heterodyne receiver, the level of the noise in the first intermediate frequency band lower than the oscillation frequency becomes lower as compared with a conventional technique. Consequently, the S/N ratio of the intermediate frequency signal is improved.

Figure 2:
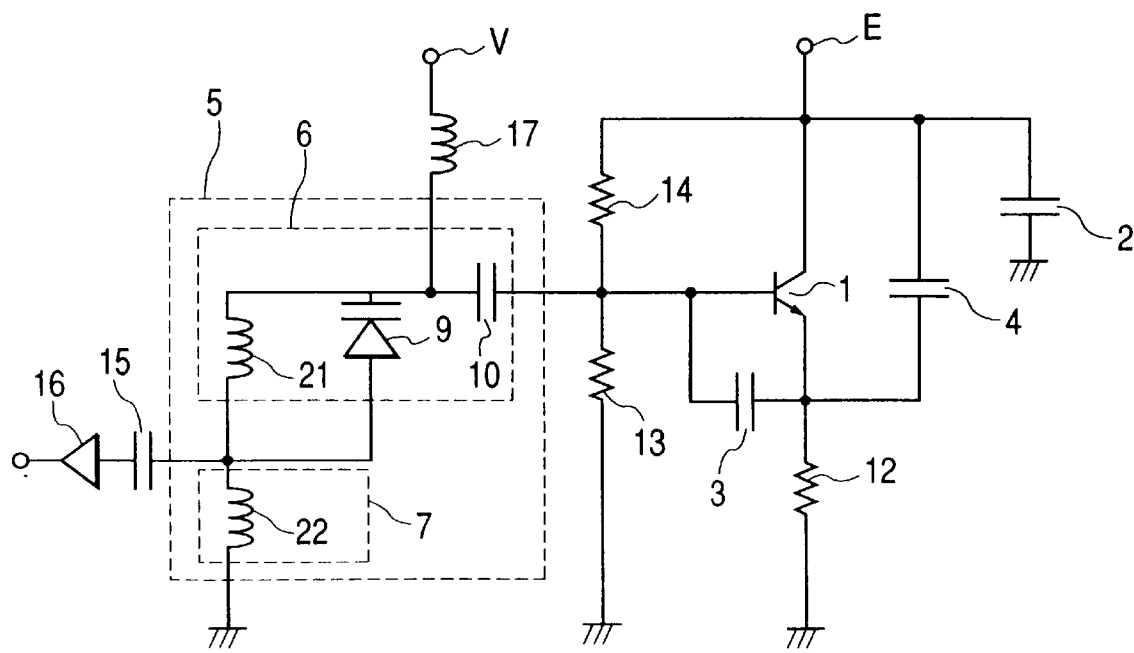
FIG. 2 is a circuit diagram showing another configuration of the oscillation circuit of the invention.

FIG. 2 shows another embodiment of the oscillation circuit of the invention. The configuration of the first inductance means 5 in the oscillation circuit is different from that shown in FIG. 1.

In the oscillation circuit, the first inductance means 5 is constructed by a circuit in which the second inductance means 6 and the third inductance means 7 are connected in series.

The third inductance means 7 is constructed by a fourth inductor 22. The second inductance means 6 comprises the clap capacitor 10 and the varactor diode 9 and the third inductor 21 which are connected in parallel to each other. One ends of the varactor diode 9 and the third inductor 21 are connected to the fourth inductance 22 and the other ends are connected to the clap capacitor 10.

An oscillation signal outputted from the connection point of the third and fourth inductors 21 and 22 is supplied to the amplifier 16 via the pickup capacitor 15 and supplied from the amplifier 16 to a mixing circuit (not shown).

A control voltage V is applied by the choke coil 17 to the cathode of the varactor diode 9. As the control voltage V is lowered, the capacity of the varactor diode 9 increases and an inductance equivalent value of the second inductance means 6 becomes large. Consequently, an inductance equivalent value of the first inductance means 5 increases and the oscillation frequency is lowered.

When the inductance value of the second inductance means 6 becomes large, the ratio of the level of the oscillation signal generated at both ends of the third inductance means 7 to the level of the oscillation signal generated at both ends of the first inductance means 5 is lowered. Consequently, as the oscillation frequency is lowered, the oscillation signal outputted from the connection point between the third inductor 21 and the fourth inductor 22 becomes smaller.

As the frequency is lowered, the level of noise included in the oscillation signal is similarly lowered.

When the oscillation circuit is used as a local oscillation circuit of the upper heterodyne receiver, the level of noise in the first intermediate frequency band lower than the oscillation frequency becomes lower as compared with a conventional technique. Consequently, the S/N ratio of the intermediate frequency signal is improved.

Figure 3:
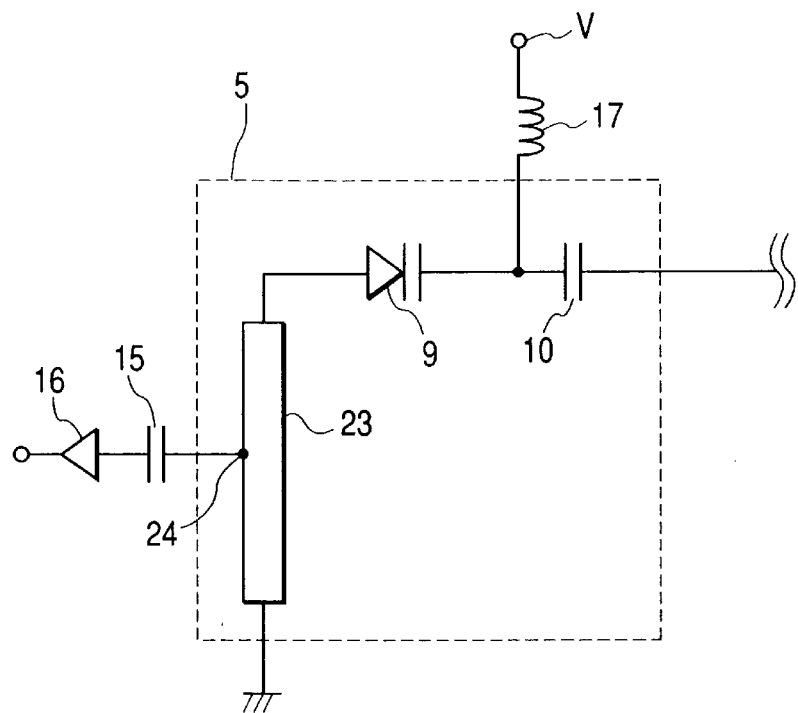
FIG. 3 is a circuit diagram showing another configuration of the oscillation circuit of the invention.

FIG. 3 illustrates a modification of the embodiment of FIG. 1, in which a first microstrip line 23 constructed by integrating the first inductor 8 and the second inductor 11 in FIG. 1 is used.

An oscillation signal is supplied from a tap position 24 at some midpoint of the first microstrip line 23 to the amplifier 16 via the pickup capacitor 15 and then supplied from the amplifier 16 to a mixing circuit (not shown). An inductance value between the tap position 24 and the varactor diode 9 is set to the same as that of the first inductor 8 illustrated in FIG. 1. An inductance value between the tap position 24 and the ground is set to the same as that of the second inductor 11 shown in FIG. 1.

In this case, since the two inductors 8 and 11 can be constructed by the first microstrip line 23, the number of components is reduced and the size can be reduced.

Figure 4:
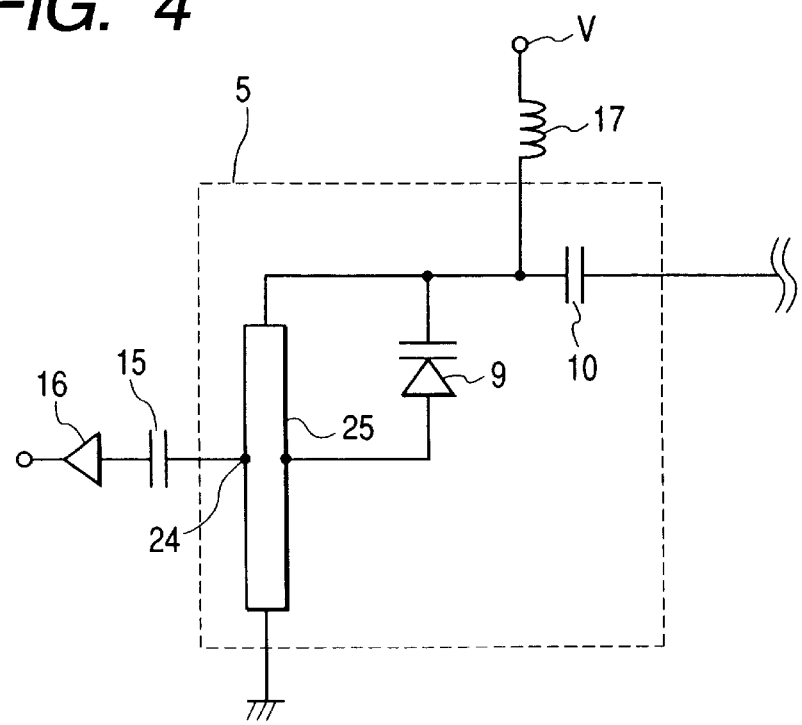
FIG. 4 is a circuit diagram showing another configuration of the oscillation circuit of the invention.
Figure 5:
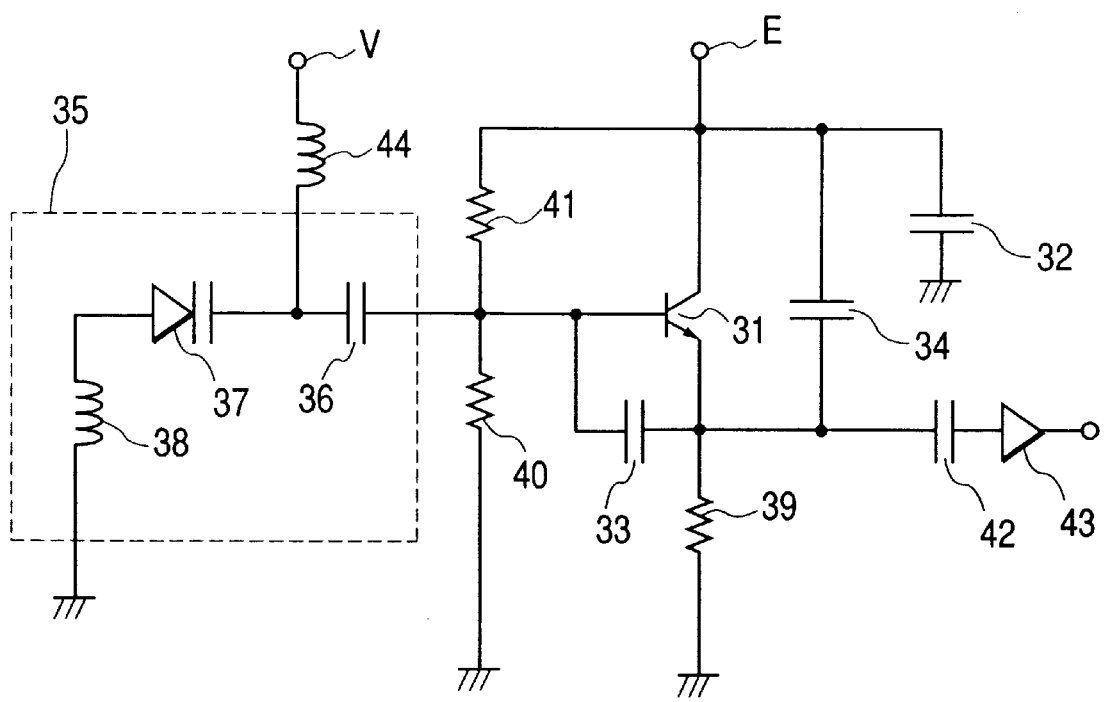
FIG. 5 is a circuit diagram showing a configuration of a conventional oscillation circuit.

Similarly, FIG. 4 shows a modification of the embodiment of FIG. 2, in which a second microstrip line 25 constructed by integrating the third and fourth inductors 21 and 22 in FIG. 2 is used.

An oscillation signal is supplied from a tap position 26 at some midpoint of the second microstrip line 25 to the amplifier 16 via the pickup capacitor 15 and then supplied from the amplifier 16 to a mixing circuit (not shown). An inductance value between the cathode side of the varactor diode 9 and the tap position 26 is set to the same as that of the third inductor 21 illustrated in FIG. 2. An inductance value between the tap position 26 and the ground is set to the same as that of the fourth inductor 22 shown in FIG. 2.

In this case as well, since the two inductors 21 and 22 can be constructed by the second microstrip line 25, the number of components is reduced and the size can be reduced.

As mentioned above, the oscillation circuit of the invention comprises the feedback capacitor and the first inductance means which constructs a parallel resonance circuit together with the feedback capacitor. The first inductance means is comprised of second inductance means whose inductance equivalent value increases as the frequency is lowered and third inductance means which is connected to the second inductance means in series, and an oscillation signal is outputted from both ends of the third inductance means. Consequently, noises at frequencies lower than the oscillation frequency are reduced. As a result, by using the oscillation circuit as a local oscillator of the upper heterodyne receiver, the S/N ratio of the first intermediate frequency signal is improved.

The second inductance means of the oscillation circuit of the invention comprises the first inductor and the variable capacitor which is connected to the first inductor in series, and the frequency of the oscillation signal is controlled by varying the capacity value of the variable capacitor. Thus, by varying the capacity of the variable capacitor, the inductance equivalent value of the first inductance means can be controlled.

The third inductance means of the oscillation circuit of the invention is constructed by the second inductor, the first inductor and the second inductor are connected in series and are integrated as a first microstrip line, and the oscillation signal is outputted from a some midpoint in the longitudinal direction of the first microstrip line. Thus, the number of parts is decreased and the size can be reduced.

The second inductance means of the oscillation circuit of the invention comprises the third inductor and the variable capacitor which is connected to the third inductor in parallel, and the frequency of the oscillation signal is controlled by changing the capacity value of the variable capacitor. Consequently, by changing the capacity of the variable capacitor, the inductance equivalent value of the first inductance means can be controlled.

The third inductance means of the oscillation circuit of the invention is constructed by the fourth inductor, the third inductor and the fourth inductor are connected in series and are integrated as a second microstrip line, and the oscillation signal is outputted from a some midpoint in the longitudinal direction of the second microstrip line. The number of parts is therefore decreased and the size can be reduced.

According to the oscillation circuit of the invention, the variable capacitor is constructed by a varactor diode and the frequency of the oscillation signal is controlled by changing a control voltage which varies the capacity of the varactor diode. Consequently, by changing the control voltage, the inductance equivalent value of the second inductance means can be increased or decreased.

According to the oscillation circuit of the invention, one end of the third inductance means is connected to the ground in a high frequency manner. Consequently, only by outputting the oscillation signal between the first and second inductance means 6 and 7, as the frequency becomes lower, the level of noise is reduced as the frequency is lowered.

What is claimed is:

1. An oscillation circuit comprising a feedback capacitor and first inductance means which constructs a parallel resonance circuit together with the feedback capacitor, wherein the first inductance means is comprised of second inductance means whose inductance equivalent value increases as the frequency is lowered and third inductance means which is connected to the second inductance means in series, and an oscillation signal is outputted from both ends of the third inductance means.

2. An oscillation circuit according to claim 1, wherein the second inductance means comprises a first inductor and a variable capacitor which is connected to the first inductor in series, and the frequency of the oscillation signal is controlled by varying the capacity value of the variable capacitor.

3. An oscillation circuit according to claim 2, wherein the third inductance means is constructed by a second inductor, the first inductor and the second inductor are connected in series and are integrated as a first microstrip line, and the oscillation signal is outputted from a some midpoint in the longitudinal direction of the first microstrip line.

4. An oscillation circuit according to claim 2, wherein the variable capacitor is constructed by a varactor diode and the frequency of the oscillation signal is controlled by changing the control voltage which varies the capacity of the varactor diode.

5. An oscillation circuit according to claim 1, wherein the second inductance means comprises a third inductor and a variable capacitor which is connected to the third inductor in parallel, and the frequency of the oscillation signal is controlled by changing the capacity value of the variable capacitor.

6. An oscillation circuit according to claim 5, wherein the third inductance means is constructed by a fourth inductor, the third inductor and the fourth inductor are connected in series and are integrated as a second microstrip line, and the oscillation signal is outputted from a some midpoint in the longitudinal direction of the second microstrip line.

7. An oscillation circuit according to claim 5, wherein the variable capacitor is constructed by a varactor diode and the frequency of the oscillation signal is controlled by changing a control voltage which varies the capacity of the varactor diode.

8. An oscillation circuit according to claim 1, wherein one end of the third inductance means is connected to the ground in a high frequency manner.

* * * * *